United States Patent [19]

Heinecke

[11] 3,940,506

[45] Feb. 24, 1976

[54] SELECTIVE PLASMA ETCHING AND DEPOSITION

[75] Inventor: Rudolf August Herbert Heinecke, Harlow, England

[73] Assignee: ITT Industries, Inc., New York, N.Y.

[22] Filed: May 3, 1974

[21] Appl. No.: 466,570

[30] Foreign Application Priority Data

May 17, 1973 United Kingdom............... 23527/73

[52] U.S. Cl. .......................... 427/38; 156/7; 156/8; 156/17; 427/41; 427/271
[51] Int. Cl.²............................................ B05D 3/06
[58] Field of Search ...... 156/8, 17, 7; 117/93.1 GD, 117/8, 8.5; 427/38, 41, 271

[56] References Cited
UNITED STATES PATENTS 3,615,956  10/1971  Irving et al............................ 156/17
3,795,557  3/1974  Jacob................................... 156/8

*Primary Examiner*—J. H. Newsome
*Attorney, Agent, or Firm*—John T. O'Halloran; Menotti J. Lombardi, Jr.; Vincent Ingrassia

[57] ABSTRACT

This invention relates to a method of selectively treating the surface of an article comprising silicon in part and either silica or silicon nitride in part wherein either the silicon or the silicon compound is etched at a greater rate or a fluoropolymer is deposited on the article by placing the article in a plasma containing fluorine, carbon and reducing species and adjusting the concentration of the reducing species to selectively etch the silicon at a greater rate, etch the silicon compound at a greater rate or deposit polymer.

18 Claims, No Drawings

SELECTIVE PLASMA ETCHING AND DEPOSITION

BACKGROUND OF THE INVENTION

This invention relates to plasma etching and polymer formation.

Equal proportions of oxidizing and reducing species are produced by supplying a plasma with carbon tetrafluoride, and the etch rate of silicon in such a plasma is typically found to be of the order of forty five times that of its oxide and twenty times that of its nitride. In semiconductor device manufacture many etching applications exist, such as in silicon planar technology, wherein a reduced, or preferably a reversed, etch rate ratio is desired.

SUMMARY OF THE INVENTION

It is an object of the present invention to obtain a reduced etch rate ratio, and in some instances a reversed etch rate ratio by modifying the gas supply to the plasma so as to produce a preponderance of reducing species.

One way of achieving the above described preponderance is to add hydrogen to the supply of carbon tetrafluoride; another is to add the hydrogen in the form of a chemical compound such as ammonia. Hydrogen can alternatively be introduced into the plasma by using a partially fluorine substituted hydrocarbon, such as $CHF_3$ or $C_2HF_5$ in place of carbon tetrafluoride. Yet another way of achieving a reduced etch rate ratio involves increasing the proportion of carbon to fluorine in the plasma by replacing carbon tetrafluoride with an alternative fully fluorine substituted hydrocarbon such as perfluoro-ethane or perfluoropropane. The use of perfluoro-ethane provides a $Si/SiO_2$ etch rate ratio lying typically in the range 7:1 to 3:1 whereas with perfluoro-ethane the etch rate ratio is reversed, its value lying typically in the range 1:1 to 1:5.

It is believed that when the treatment is used for etching silicon and silica a competitive process is involved between the etching of the two materials, and that the competitive etching of silica is favored by a preponderance of reducing species. This theory is supported by the observed reduction in the etch rate of silica which accompanies the addition of oxygen or other oxidizing gases to a plasma supplied with a fully fluorine substituted hydrocarbon whereas the etch rate of silicon is substantially unaltered. Thus the presence of oxygen or other oxidizing gases is undesirable when etching silica, though a small amount, present as an impurity in the gas supply, can be tolerated.

Another halogen can be substituted for part of the fluorine, thus for instance the plasma can be supplied with a gas mixture comprising hydrogen and, instead of carbon tetrafluoride, difluoro-dichloromethane or trifluoro-monochloromethane.

If, under specified conditions, the plasma is supplied with more than a certain amount of hydrogen gas the treatment changes its character from an etching process to a polymer film deposition process. Polymer film deposition can also result from plasma treatment under appropriate conditions using certain specific fluorine, carbon and hydrogen containing compounds such as trifluoromethane.

DESCRIPTION OF THE PREFERRED EMBODIMENTS

There follows a description of processes embodying the invention in preferred forms.

An apparatus suitable for performing the treatment consists essentially of four items: a 12 inch diameter bell jar system, a gas train for leaking gases or mixtures of gases into the bell jar, an r.f. generator for sustaining a plasma within the bell jar, and a vacuum pump. Workpieces are supported in the bell jar upon a 10 inch diameter aluminum platform. The r.f. generator is capable of delivering 500 watts at 1.3 MHz, and the power is capacitatively coupled into the plasma using an aluminium foil cap fitted to the outside of the bell jar. A suitable vacuum pump consists of a single stage 450 $l$/min pump connected with the bell jar via 2 inch diameter copper piping.

In the etching of a semiconductor slice this apparatus, with a plasma established in carbon tetrafluoride at a pressure of 0.07 torr, the etch rate of silica is typically in the region of 200 A per minute, whereas that of silicon is typically forty five times greater. The addition of hydrogen gas to the plasma significantly reduces this etch rate ratio. Thus, with a plasma established in a gas mixture having a partial pressure of 0.07 torr carbon tetrafluoride and 0.03 torr hydrogen, the etch rate of silica is not substantially changed, whereas the etch rate of silicon is reduced to give an etch rate ratio of silicon to silica lying typically in the range 2:1 to 1:5. The actual value of etch rate ratio appears to depend upon a number of parameters including not only the gas pressures but also the gas flow rates.

Two further points should be noted in connection with etch rates. Firstly, the etch rates are modified not only by gases but also by reaction products from solids such as carbon. Thus the etch rate ratio of 45:1 quoted in connection with the use of carbon tetrafluoride is a typical ratio obtained when using aluminium as a mask material, whereas if black wax is used for masking, the etch rate of silicon is significantly reduced, resulting in an etch rate ratio in the region of 12:1. Secondly it should be noted that, for etching, it is possible to add too much hydrogen. If more than a certain amount of hydrogen is added to the carbon tetrafluoride etching ceases and a polymer deposit forms. This deposit is removed if the hydrogen supply is cut off. The concentration of hydrogen sufficient to cause the formation of the deposit depends upon plasma conditions. In the apparatus described above more than 40% hydrogen tends to result in the formation of a polymer deposit.

The addition of hydrogen or carbon to the plasma established in carbon tetrafluoride has the effect of providing a preponderance of reducing species, and of reducing the etch rate ratio. It is not necessary for the increased proportion of hydrogen or carbon to be introduced into the plasma chemically uncombined with anything else. In the case of carbon however there is the disadvantage of using carbon per se that it is a solid, and hence its effect upon the etch rate ratio tends to be localized. By way of example an alternative way of increasing the proportion of carbon in the plasma, without the attendant disadvantages of using a solid, is to replace the supply of carbon tetrafluoride with a supply of perfluoropropane. This reduces the etch rate ratio typically to the extent that the ratio is reversed and silica is etched at a faster rate than silicon.

A reduction in the etch rate of silicon is generally also accompanied by a reduction in the etch rate of photoresists. Where this is the case thinner photoresist layers may be used and a higher resolution achieved.

It is to be understood that the foregoing description of specific examples of this invention is made by way of example only and is not to be considered as a limitation on its scope.

What is claimed is:

1. A process for etching an article comprised in part of silicon and in part of a substance selected from a group consisting of silica and silicon nitride, said process comprising the steps of:
    etching said article in a plasma containing fluorine, carbon and reducing species; and
    adjusting the concentration of reducing species in the plasma to which the article is exposed, whereby the relative etch rates of silicon and the second substance is controlled by adjusting said concentration.

2. A process as claimed in claim 1 wherein the plasma is supplied with a mixture of hydrogen and carbon tetrafluoride.

3. A process as claimed in claim 1 wherein the plasma is applied with a mixture of ammonia and carbon tetrafluoride.

4. A process as claimed in claim 1 wherein the plasma is supplied with a partially fluorine substituted hydrocarbon.

5. A process as claimed in claim 1 wherein the plasma is supplied with a fully fluorine substituted hydrocarbon.

6. A process as claimed in claim 5 wherein the plasma is supplied with perfluoro-propane.

7. A process according to claim 1 further comprising the step of adding an alternative halogen for part of the fluorine in the fluorine containing compound.

8. A process as claimed in claim 7 wherein part of the surface of the article is silicon and part silica.

9. A process as claimed in claim 7 wherein part of the surface of the article is silicon and part silicon nitride.

10. A process as claimed in claim 7 wherein the article is a semiconductor slice.

11. In a process for selectively treating an article comprised in part of silicon and in part of a second substance selected from a group consisting of silica and silicon nitride, said treatment being selected from a group of treatments comprising: (a) etching said silicon at a rate greater than said second substance, (b) etching said second substance at a rate greater than said silicon and (c) depositing a polymer onto the surface of said article, said process comprising the steps of:
    placing the article in a plasma containing fluorine, carbon and a reducing species; and
    selecting the desired treatment by adjusting the concentration of reducing species in the plasma to which the article is exposed, whereby treatments (a), (b) and (c) are performed at relatively increasing concentrations, respectively.

12. A process according to claim 11 wherein the plasma is supplied with a mixture of hydrogen and carbon tetrafluoride.

13. A process according to claim 11 wherein the plasma is supplied with a mixture of ammonia and carbon tetrafluoride.

14. A process according to claim 11 wherein the plasma is supplied with a partially fluorine-substituted hydrocarbon.

15. A process according to claim 11 wherein the plasma is supplied with a fully chlorine-substituted hydrocarbon.

16. A process according to claim 15 wherein the plasma is supplied with perfluoro-propane.

17. A process according to claim 11 further comprising the step of adding an alternative halogen for part of the fluorine in a fluorine-containing compound.

18. In a process for treatment of an article having a surface comprised in part of silicon and in part of a substance from the group consisting of silica and silicon nitride, said treatment comprising selectively (a) etching said surface wherein said silicon is etched at a greater rate than said silica or silicon nitride, (b) etching said surface wherein said silica or silicon nitride is etched at a greater rate than said silicon, or (c) depositing a polymer onto said surface, the steps comprising:
    placing said article in a plasma containing fluorine, carbon and reducing species; and
    adjusting the relative amount of reducing species to perform at will and in any desired sequence, the treatments defined above as (a), (b) and (c) wherein with the particular carbon fluorine and reducing species selected, the treatment (a) is performed at a certain concentration of reducing species and the treatments (b) and (c) are performed at relatively higher concentrations of reducing species.

* * * * *